(12) United States Patent
Liu

(10) Patent No.: US 8,011,808 B2
(45) Date of Patent: Sep. 6, 2011

(54) LED ILLUMINATION DEVICE AND LIGHT ENGINE THEREOF

(75) Inventor: Tay-Jian Liu, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 334 days.

(21) Appl. No.: 12/392,081

(22) Filed: Feb. 24, 2009

(65) Prior Publication Data

US 2009/0230834 A1    Sep. 17, 2009

(30) Foreign Application Priority Data

Mar. 14, 2008   (CN) .......................... 2008 1 0065846

(51) Int. Cl.
    *F21V 29/00*   (2006.01)
(52) U.S. Cl. ........................ 362/294; 362/373
(58) Field of Classification Search .................. 362/294, 362/373, 341, 547, 580, 126, 218, 264, 345, 362/390
    See application file for complete search history.

(56) References Cited

U.S. PATENT DOCUMENTS

| 7,494,298 B2 * | 2/2009 | Perkins ..................... 405/129.55 |
| 7,661,853 B2 * | 2/2010 | Kuo et al. ..................... 362/373 |
| 7,722,217 B2 * | 5/2010 | Chen ......................... 362/249.02 |
| 2006/0044804 A1 * | 3/2006 | Ono et al. ..................... 362/294 |
| 2007/0253202 A1 * | 11/2007 | Wu et al. ......................... 362/294 |
| 2007/0285926 A1 * | 12/2007 | Maxik ............................ 362/294 |
| 2008/0007955 A1 * | 1/2008 | Li ................................. 362/294 |
| 2008/0043472 A1 * | 2/2008 | Wang ............................. 362/294 |
| 2008/0089070 A1 * | 4/2008 | Wang ............................. 362/294 |

FOREIGN PATENT DOCUMENTS

| CN | 2809411 Y | 8/2006 |
| CN | 200979139 Y | 11/2007 |

* cited by examiner

*Primary Examiner* — Bao Q Truong
(74) *Attorney, Agent, or Firm* — Altis Law Group, Inc.

(57) ABSTRACT

An LED illumination device includes an optical section at a front end thereof, an electrical section at a rear end thereof, and a heat dissipation section between the optical section and the electrical section. The optical section includes an LED electrically connecting with the electrical section, and a light output housing around the LED. The heat dissipation section includes a U-shaped heat pipe, a heat sink and a mounting seat. The heat pipe includes an evaporation section and two condensation sections extending backwardly from two opposite ends of the evaporation section, respectively. The condensation sections are inserted into the heat sink. The mounting seat bestrides on the evaporation section. The LED thermally connects with evaporation section via the mounting seat.

10 Claims, 12 Drawing Sheets

LED ILLUMINATION DEVICE AND LIGHT ENGINE THEREOF

BACKGROUND

1. Technical Field

The disclosure generally relates to light emitting diode (LED) illumination devices, and particularly to an LED illumination device with a light engine, which has high heat dissipation efficiency.

2. Description of Related Art

It is well known that LEDs have been widely used in illumination devices to substitute for conventional cold cathode fluorescent lamps (CCFLs) due to a high brightness, a long lifespan, and a wide color range of the LED.

For an LED, eighty percents to ninety percents of the power consumed thereby is converted into thermal energy, and only ten percents to twenty percents of the power consumed by the LED is converted into light. In addition, a plurality of LEDs are generally packaged in a single LED illumination device in order to obtain a desirable illumination brightness. Therefore, for a high brightness LED illumination device, a highly efficient heat dissipation device is required in order to timely and adequately remove the heat generated by the LED illumination device. Otherwise, the brightness, lifespan, and reliability of the LED illumination device will be seriously affected. However, conventional heat dissipation devices, such as heat sinks or a combination of heat sink and cooling fan, can no longer satisfy the heat dissipation requirement of the high brightness LED illumination device.

What is needed, therefore, is an LED illumination device which overcomes the described limitations.

BRIEF DESCRIPTION OF THE DRAWINGS

Many aspects of the present LED illumination device can be better understood with reference to the following drawings. The components in the drawings are not necessarily drawn to scale, the emphasis instead being placed upon clearly illustrating the principles of the disclosed LED illumination device. Moreover, in the drawings, like reference numerals designate corresponding parts throughout the several views.

DETAILED DESCRIPTION OF THE EMBODIMENTS

Figure 1:
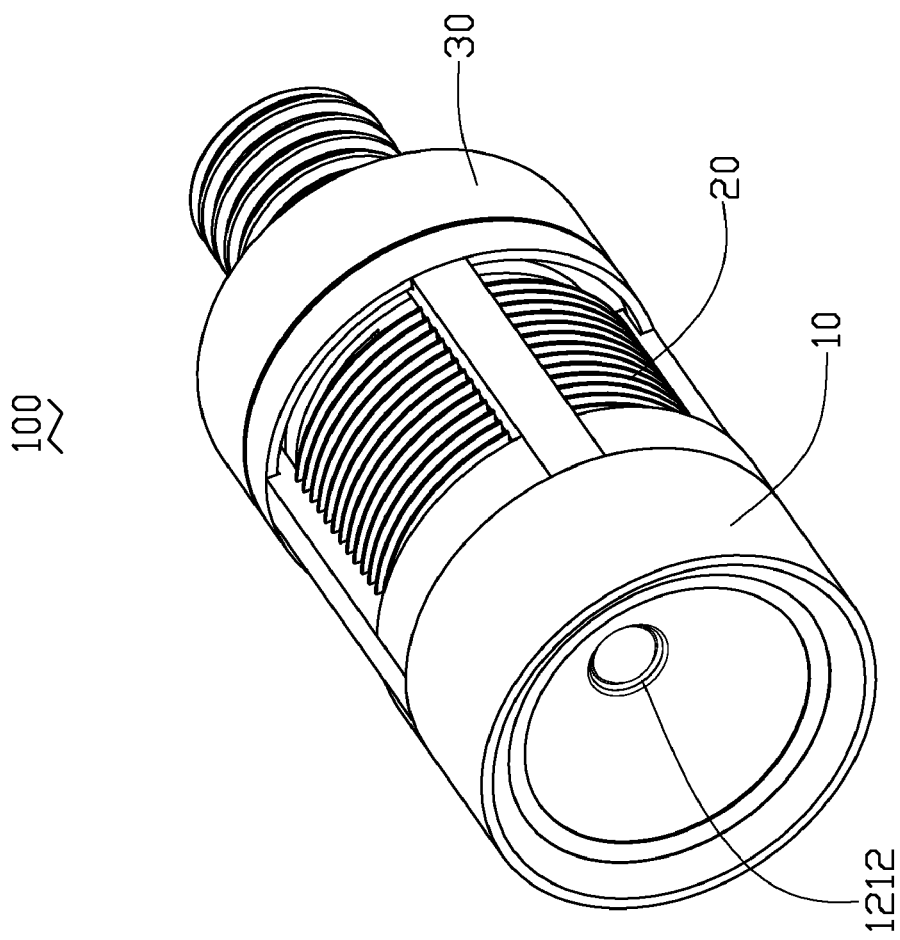
FIG. 1 is an assembled, isometric view of an LED illumination device in accordance with a first embodiment of the disclosure.
Figure 2:
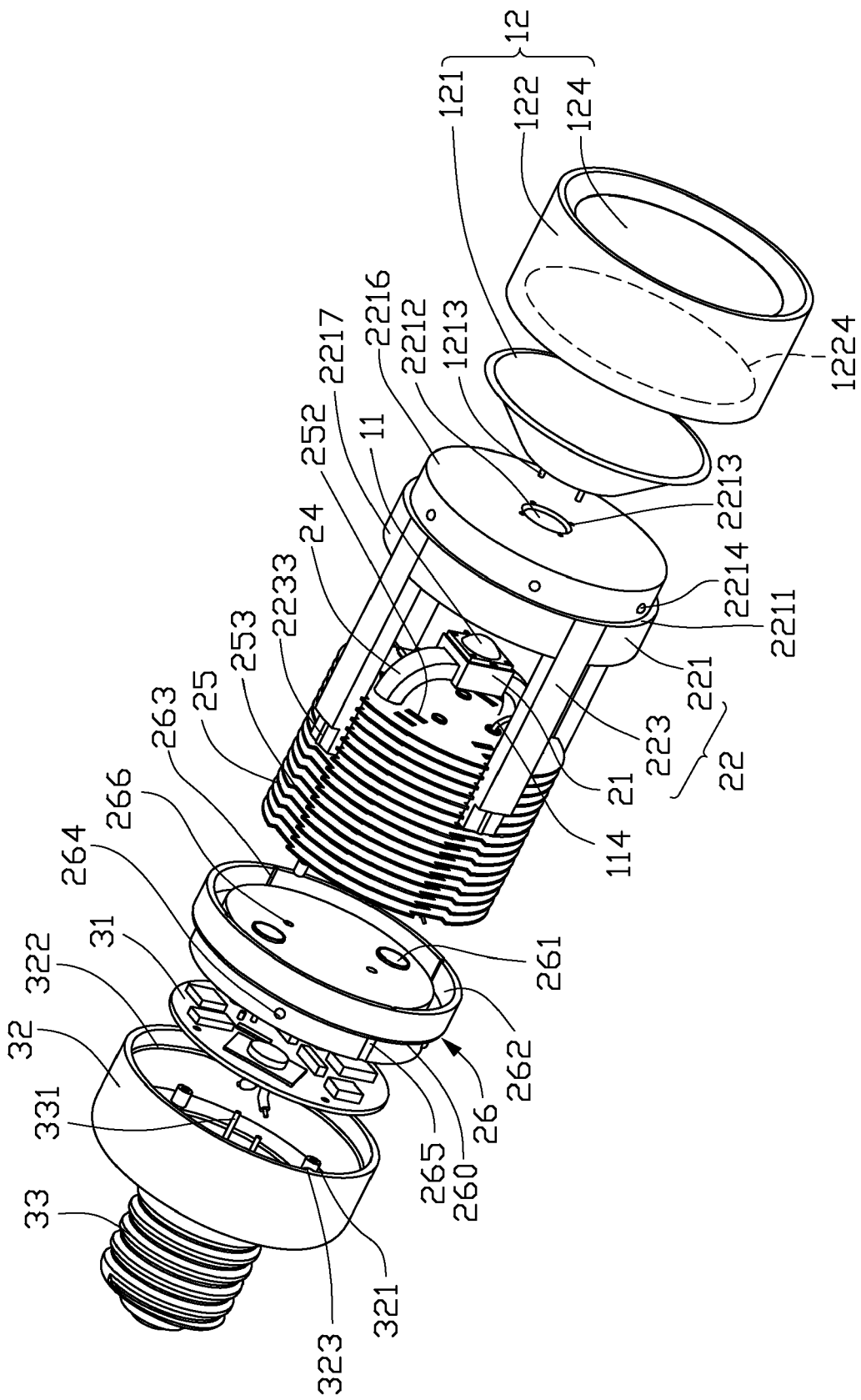
FIG. 2 is an exploded, isometric view of the LED illumination device of FIG. 1.

Referring to FIGS. 1 and 2, an LED illumination device 100 in accordance with a first embodiment of the disclosure is shown. The LED illumination device 100 includes an optical section 10, an electrical section 30, and a heat dissipation section 20 arranged between the optical section 10 and the electrical section 30. The LED illumination device 100 is substantially cylindrical. The optical section 10 is disposed at a front end of the LED illumination device 100, while the electrical section 30 is disposed at a rear end of the LED illumination device 100.

Figure 3:
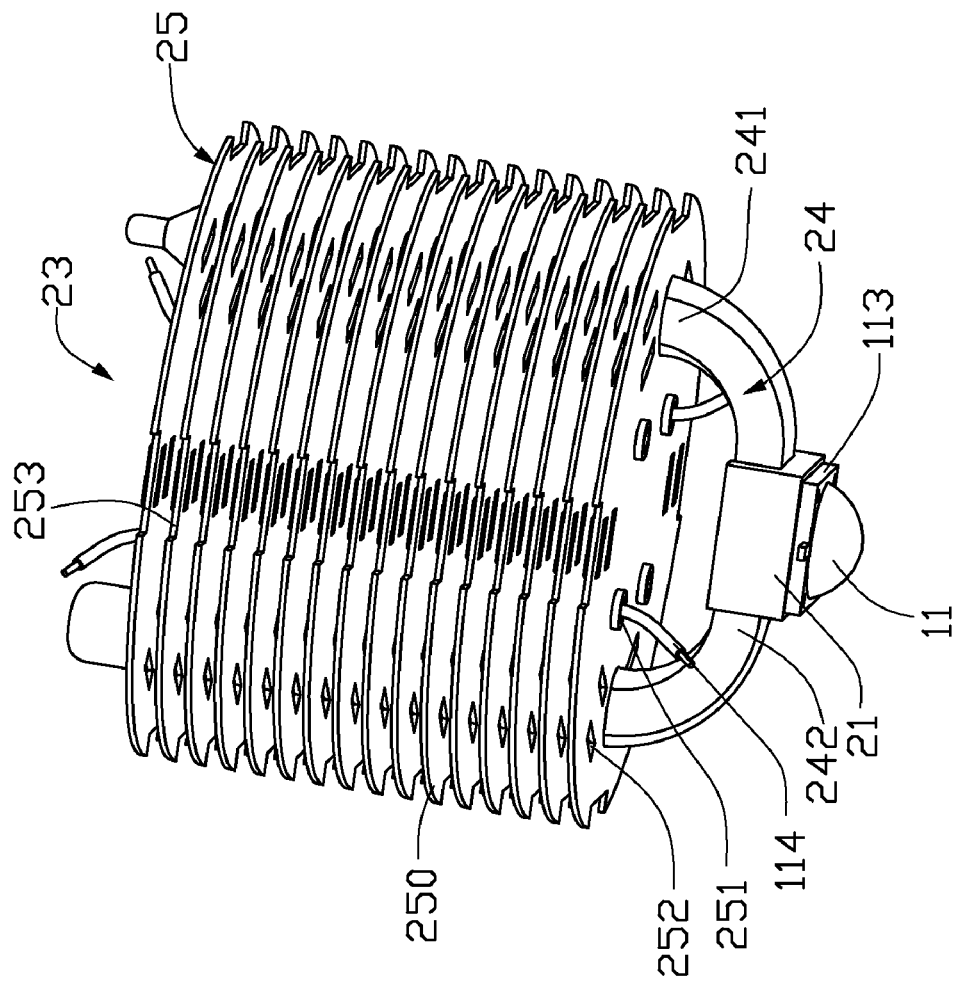
FIG. 3 is an assembled, isometric view showing a light engine of the LED illumination device of FIG. 1.
Figure 4:
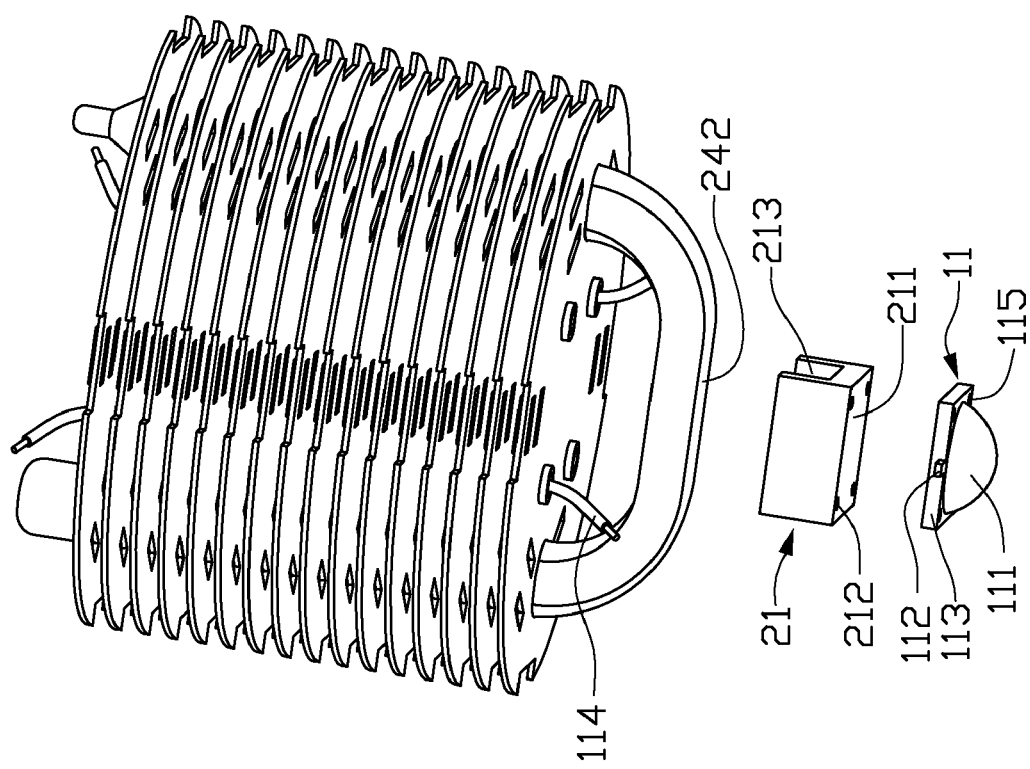
FIG. 4 is an exploded, isometric view of the light engine of FIG. 3.

The optical section 10 includes an LED 11 and a light output housing 12 around the LED 11. Referring to FIGS. 3 and 4, the LED 11 includes a substrate 113, an emitter 111 electrically connected with the substrate 113, and a pair of electrodes 112 at opposite sides of the substrate 113. A pair of electric wires 114 are provided to connect respectively to the electrodes 112 for electrically connecting the emitter 111 with the electrical section 30. The substrate 113 defines a hole 115 in each corner thereof.

Referring again to FIGS. 1 and 2, the light output housing 12 includes a light reflector 121, a shell 122, and an optical lens 124. The shell 122 is hollow and cylindrical. A rear end of the shell 122 is coupled to the heat dissipation section 20, and a front end of the shell 122 encloses the optical lens 124. The light reflector 121 and the LED 11 are received in the shell 122. The shell 122 provides protection for the LED 11 and the light reflector 121. The shell 122 defines a circular engaging groove 1224 at the rear end in an inner circumferential surface thereof. The light reflector 121 is hollow and has a shape like a truncated cone, which tapers from a front end thereof engaging with the front end of the shell 122 towards a rear end thereof adjacent to the heat dissipation section 20. The light reflector 121 defines an opening 1212 at the rear end for mounting the emitter 111 in the opening 1212, and has a plurality of fixing pins 1213 extending rearward from the rear end of the reflector 121 around the opening 1212. The light reflector 121 has a reflective inner surface, to redirect the light emitted from the emitter 111 toward a forward direction. The light reflector 121 and the optical lens 124 provide luminescence characteristics for the emitter 111.

The heat dissipation section 20 includes a mounting seat 21, a heat sink 25, a heat pipe 24 thermally connecting the mounting seat 21 with the heat sink 25, a frame 22 supporting the heat sink 25, and a holder 26 mechanically connecting the heat dissipation section 20 with the electrical section 30.

Referring again to FIGS. 3 and 4, the heat sink 25 includes a plurality of parallel fins 250 stacked on each other. Each of the fins 250 defines a plurality of through holes 251 and vents 252 therein. The through holes 251 receive the electric wires 114 therein, such that the electric wires 114 electrically connect the emitter 111 with the electrical section 30 conveniently. The vents 252 enable cool airflow to produce turbulence between the fins 250. The heat sink 25 further defines a plurality of latching grooves 253 at an outer circumferential surface thereof.

The heat pipe 24 is substantially U-shaped, including an evaporation section 242, and two condensation sections 241 extending upwardly and perpendicularly from two opposite ends of the evaporation section 242, respectively. The condensation sections 241 are inserted into the heat sink 25 from bottom to top, with a free end of each of the condensation sections 241 extending out of the heat sink 25. The evaporation section 242 is generally straight and flat, and is mounted in the mounting seat 21.

The mounting seat 21 thermally connects with the substrate 113 of the LED 11. The mounting seat 21 is made of a high heat conductive metal, such as copper or copper alloy. In this embodiment, the mounting seat 21 is saddle-shaped, defining a rectangular groove 213 in a rear surface thereof, which extends through a left side and a right side of the mounting seat 21. The groove 213 receives the evaporation section 242 therein, with an outer surface of the evaporation section 242 contacting intimately with an inner surface of mounting seat 21 surrounding the groove 213. A bottom surface 211 of the mounting seat 21 contacts intimately with the substrate 113. The mounting seat 21 defines a threaded hole 212 at each corner thereof corresponding to the hole 115 at each corner of the substrate 113. Fasteners such as screws are utilized to extend through the holes 115 to screw in the threaded holes 212, to thereby mount the LED 11 on the mounting seat 21. Alternatively, electrical circuits may be directly formed on the bottom surface 211 of the mounting seat 21, and the emitter 111 is directly attached to the bottom surface 211 of the mounting seat 21, whereby the substrate 113 can be omitted and a heat resistance between the emitter 111 and the mounting seat 21 is reduced.

The LED 11, the mounting seat 21, the heat pipe 24 and the heat sink 25 cooperatively form a light engine 23 for the LED illumination device 100.

Referring again to FIGS. 1 and 2, the frame 22 includes a base 221 and a plurality of arms 223 extending backwardly and axially from an outer periphery of the base 221. The base 221 has a shape like a cap. The base 221 includes a circular plate 2216 and a cylinder 2217 extending backward from an outer periphery of the circular plate 2216. Thus, a front end of the base 221 is enclosed, and a rear end of the base 221 is open. A diameter of a front portion of the cylinder 2217 is slightly less than that of a rear portion of the cylinder 2217, whereby a step 2211 is formed at an outer circumferential surface of the cylinder 2217. The base 221 defines an opening 2212 in a center of the circular plate 2216, and a plurality of fixing holes 2213 in the circular plate 2216 around the opening 2212. The opening 2212 aligns with and has a same diameter as the opening 1212 of the light reflector 121. The emitter 111 extends through the openings 1212, 2212 into the reflector 121 of the light output housing 12. The fixing pins 1213 of the light reflector 121 are inserted into the fixing holes 2213, respectively, for mounting the light reflector 121 on the base 221. Meanwhile, the mounting seat 21 and the evaporation section 242 of the heat pipe 24 are received in the base 221 and surrounded by the cylinder 2217. The base 221 forms a plurality of protuberances 2214 at an outer circumferential surface of the front portion of the cylinder 2217 thereof. An outer diameter of the front portion of the cylinder 2217 of the base 221 is slightly less than an inner diameter of the shell 122. The protuberances 2214 engage in the engaging groove 1224 of the shell 122, such that the shell 122 can be rotated around an axis of the LED illumination device 100 with respect to the base 221. The arms 223 are inserted into the latching grooves 253, respectively. Each of the arms 223 has an orientation pin 2233 formed on an outer side of a free end thereof, which extends axially towards the holder 26. The orientation pins 2233 are axially extended.

The holder 26 is cylindrical. A diameter of a front portion of the holder 26 is slightly greater than that of a rear portion of the holder 26, whereby a step 260 is formed at an outer circumferential surface of the holder 26. The holder 26 defines an annular groove 262, a pair of receiving holes 261, a pair of through holes 266, and a plurality of orientation grooves 263 in a front end thereof. The annular groove 262 aligns with the free ends of the arms 223. The receiving holes 261 align with the free end of the heat pipe 24, respectively. The through holes 266 communicate the front end with the rear end of the holder 26, and are provided for extension of the electric wires 114 therethrough. The orientation grooves 263 are axially defined in an inner circumferential surface of the holder 26, and communicate with the annular groove 262. The orientation grooves 263 align with the orientation pins 2233 at the free ends of the arms 223, respectively. The heat pipe 24, the heat sink 25 and the mounting seat 21 are received in a space cooperatively defined by the base 221, the arms 223 and the holder 26. The holder 26 forms a plurality of protuberances 264 and defines an axial orientation groove 265 at an outer circumferential surface of the rear portion thereof.

The electrical section 30 provides drive power, control circuit and power management for the LED 11. The electrical section 30 includes an enclosure 32, a circuit board 31 in the enclosure 32, and a screw base 33 at a rear end of the enclosure 32. The screw base 33 is provided for threadedly engaging in a power socket (now show) to receive an electrical power for driving the emitter 11 to lighten. An inner diameter of the enclosure 32 is substantially equal to an outer diameter of the rear portion of the holder 26. The enclosure 32 forms an axial orientation pin 323 and defines a circular engaging groove 322 in an inner circumferential surface of a front end thereof. The orientation pin 323 aligns with and is inserted into the orientation groove 265, and the protuberances 264 engage interferentially in the engaging groove 322, for mounting the enclosure 32 on the holder 26. The circuit board 31 is fixed in the enclosure 32 via a pair of supporting poles 321 extending axially in the enclosure 32. The electrical section 30 further provides a pair of electric wires 331 electrically connecting the circuit board 31 with the screw base 33, whereby the LED illumination device 100 can get the electrical power from an external power source via the screw base 33. The electric wires 114 from the LED 11 extend successively through the through holes 251 of the heat sink 25 and the through holes 266 of the holder 26, for electrically connecting the LED 11 with the circuit board 31.

In the LED illumination device 100, heat pipe technology, especially the U-shaped heat pipe 24, is utilized to effectively remove the heat generated by the emitter 111. The heat of the emitter 111 is firstly transferred to the mounting seat 21. The heat received by the mounting seat 21 is absorbed by the evaporation section 242 of the heat pipe 24, and then transferred to the heat sink 25 via the two condensation sections 242 of the heat pipe 24. The heat is finally effectively dissipated by the heat sink 25.

Figure 5:
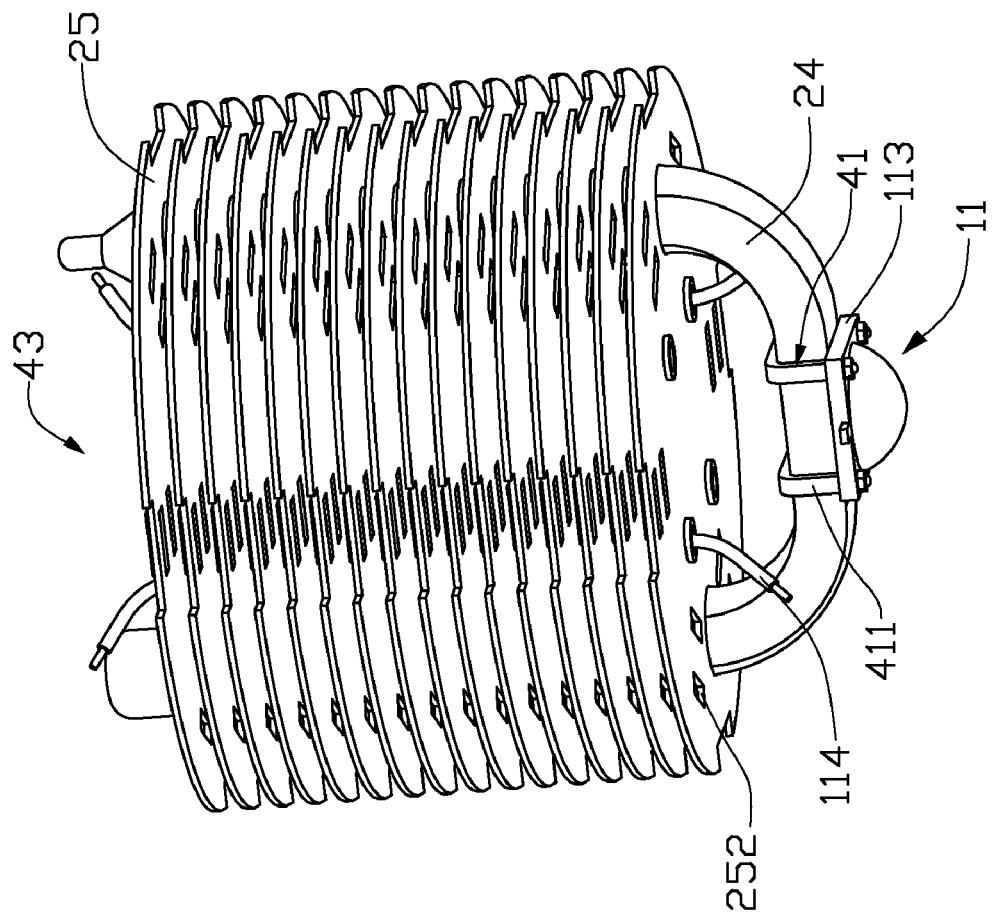
FIG. 5 is an assembled, isometric view of the light engine of the LED illumination device in accordance with a second embodiment of the disclosure.
Figure 6:
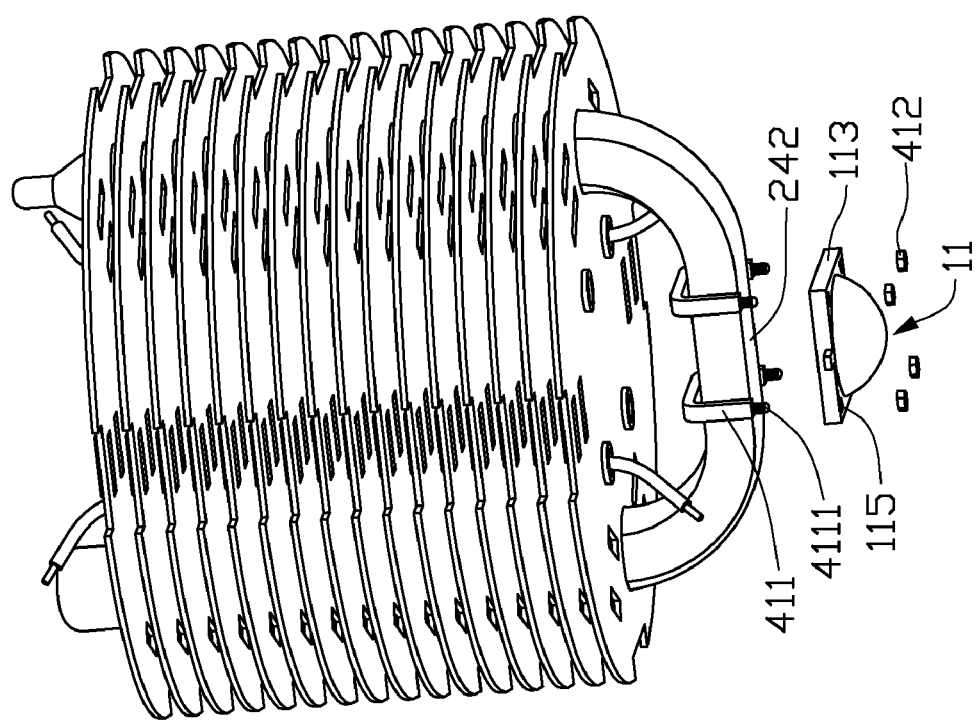
FIG. 6 is an exploded, isometric view of the light engine of FIG. 5.

Referring to FIGS. 5 and 6, a light engine 43 of the LED illumination device 100 in accordance with a second embodiment of the disclosure is shown, differing from the first embodiment only in that the mounting seat 41 includes two U-shaped fasteners 411 and a plurality of nuts 412. A free end of each of the fasteners 411 has threads 4111 thereon. The fasteners 411 bestride on the evaporation section 242 of the heat pipe 24. The free ends of the fasteners 411 extend through the holes 115 of the substrate 113 of the LED 11, respectively, to mount the heat pipe 24 intimately on the substrate 113 via a threaded engagement of the threads 4111 and the nuts 412. In this embodiment, the heat pipe 24 is directly contacted with the LED 11, to thereby reduce heat resistance of the light engine 43 between the heat pipe 24 and the LED 11.

Figure 7:
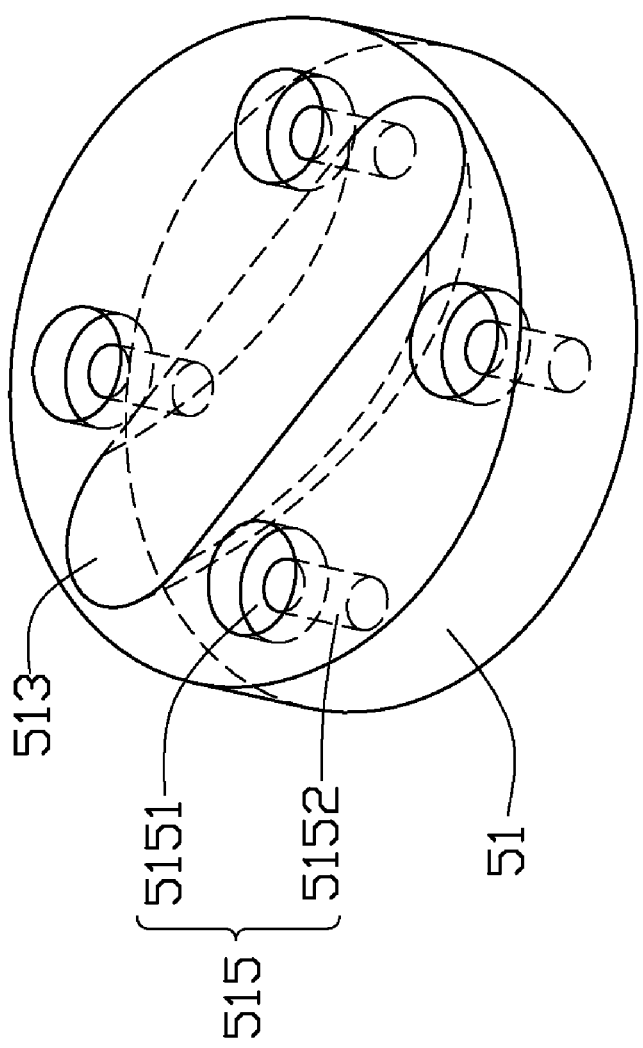
FIG. 7 is an isometric view of a mounting seat of the light engine of the LED illumination device in accordance with a third embodiment of the disclosure.

Referring to FIG. 7, the mounting seat 51 of the light engine of the LED illumination device in accordance with a third embodiment of the disclosure is shown, differing from the first embodiment only in that the mounting seat 51 is round disc-shaped, and defines an arcuate groove 513 and a plurality of threaded holes 515 at two opposite sides of the groove 513. The arcuate groove 513 is provided for matching with an arcuate evaporation section of an alternative heat pipe. Each of the threaded holes 515 includes a top hole 5151 and a bottom hole 5152 communicating with the top hole 5151. The top hole 5151 is coaxial to the bottom hole 5152, and has a diameter greater than that of the bottom hole 5152, for matching with an alternative screw having a corresponding configuration.

Figure 8:
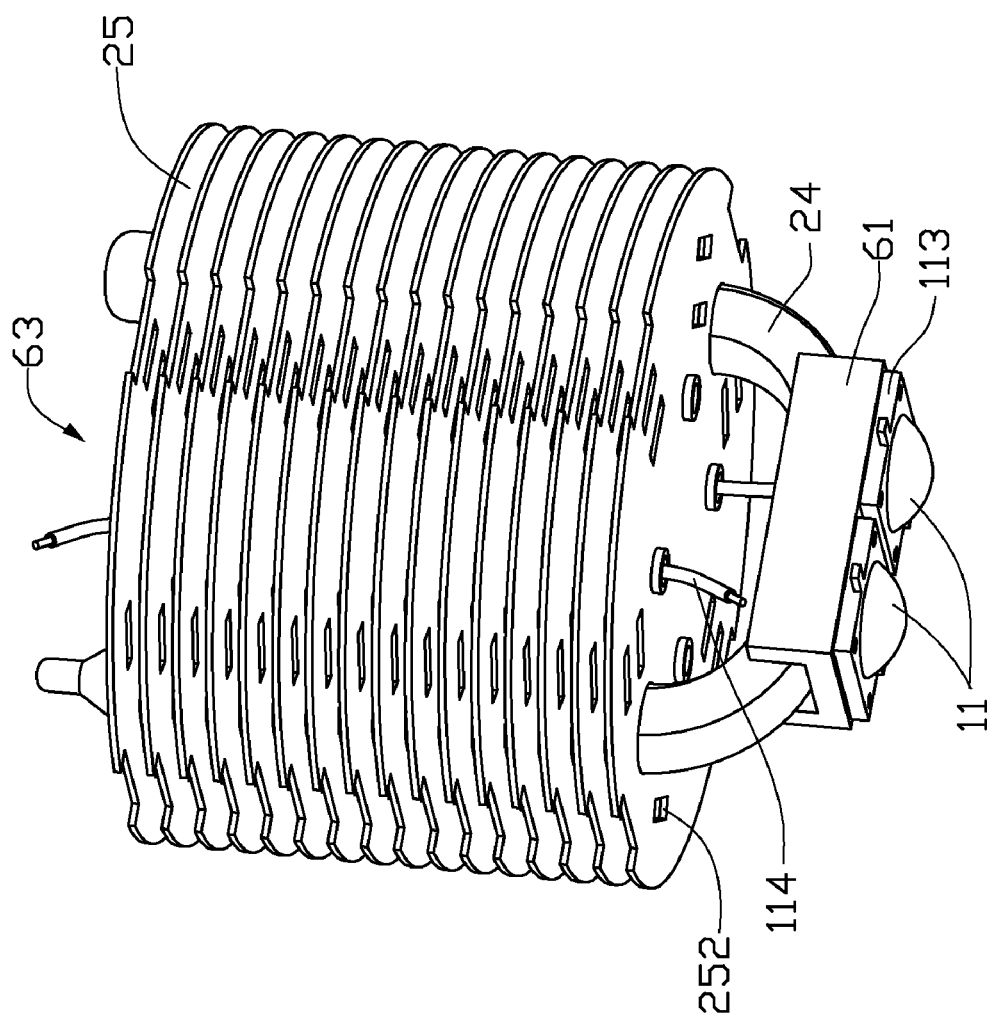
FIG. 8 is an assembled, isometric view of the light engine of the LED illumination device in accordance with a fourth embodiment of the disclosure.
Figure 9:
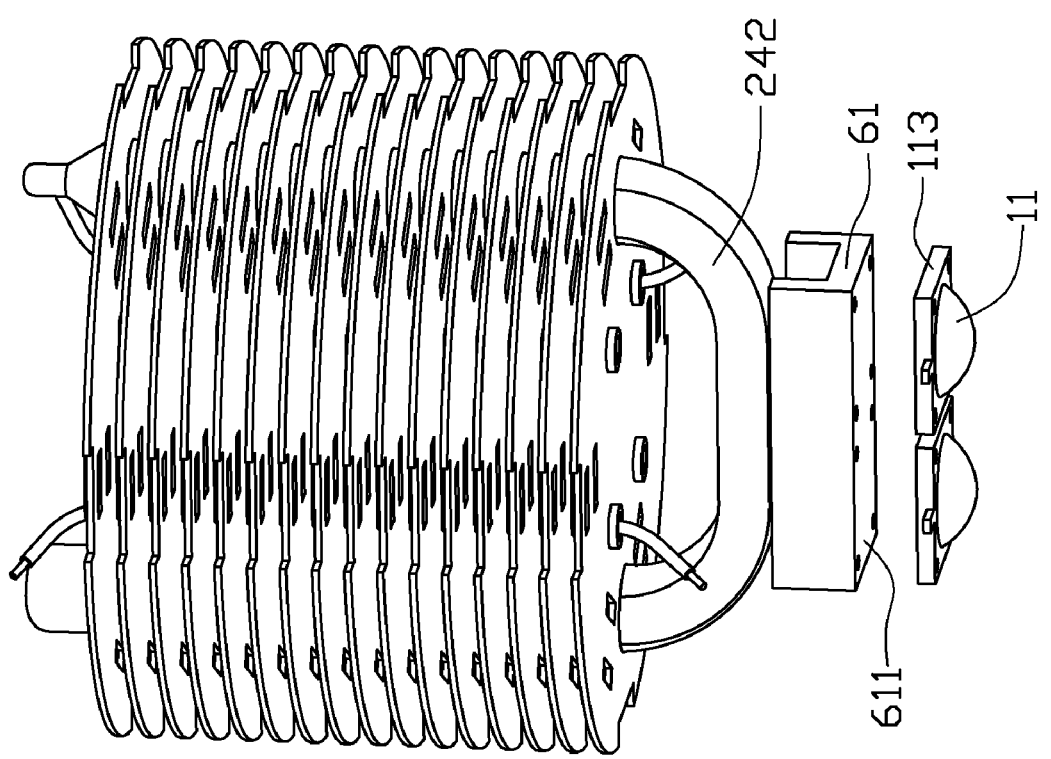
FIG. 9 is an exploded, isometric view of the light engine of FIG. 8.

Referring to FIGS. 8 and 9, the light engine 63 of the LED illumination device 100 in accordance with a fourth embodiment of the disclosure is shown, differing from the first embodiment only in that the mounting seat 61 bestriding on the evaporation section 242 of the heat pipe 24 is longer than the mounting seat 21 in the first embodiment, and there are two LEDs 11 mounted on the mounting seat 61. In addition, the structures of the base 221 and the light reflector 121 are correspondingly modified for accommodating the LEDs 11.

Figure 10:
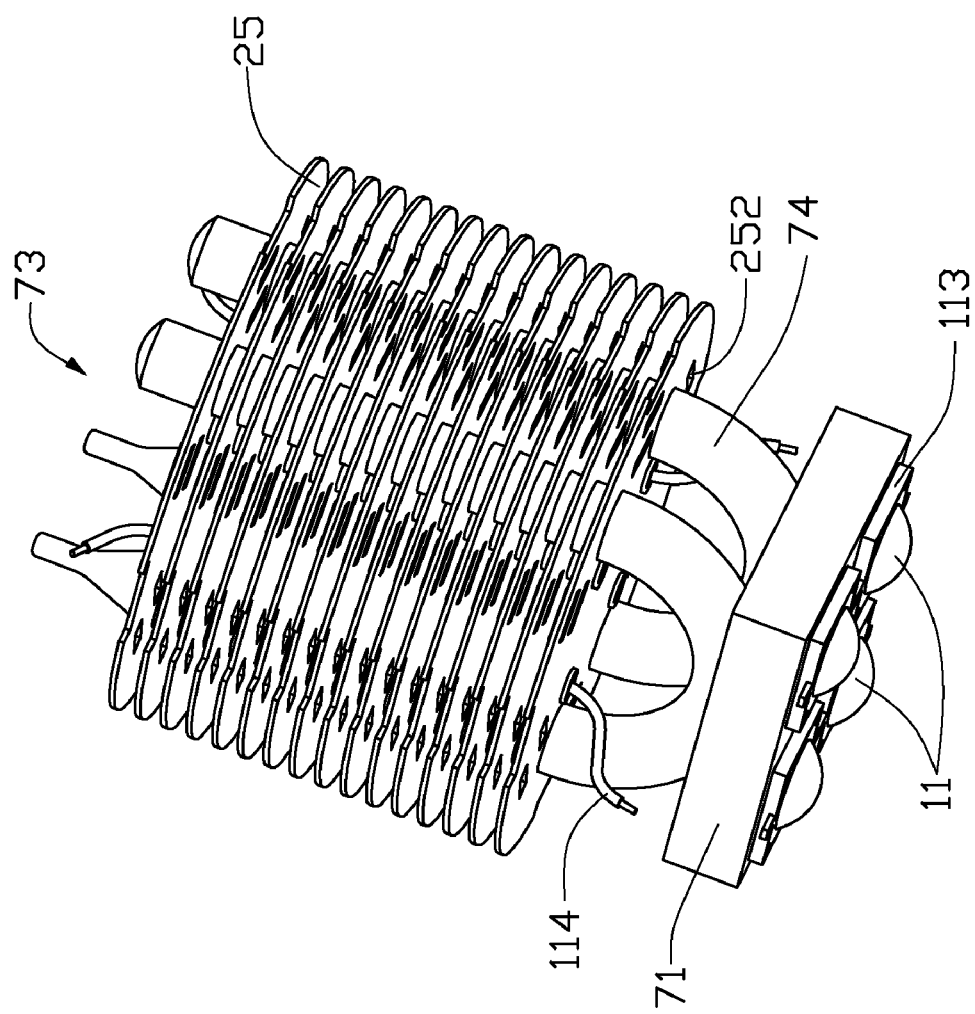
FIG. 10 is an assembled, isometric view of the light engine of the LED illumination device in accordance with a fifth embodiment of the disclosure.
Figure 11:
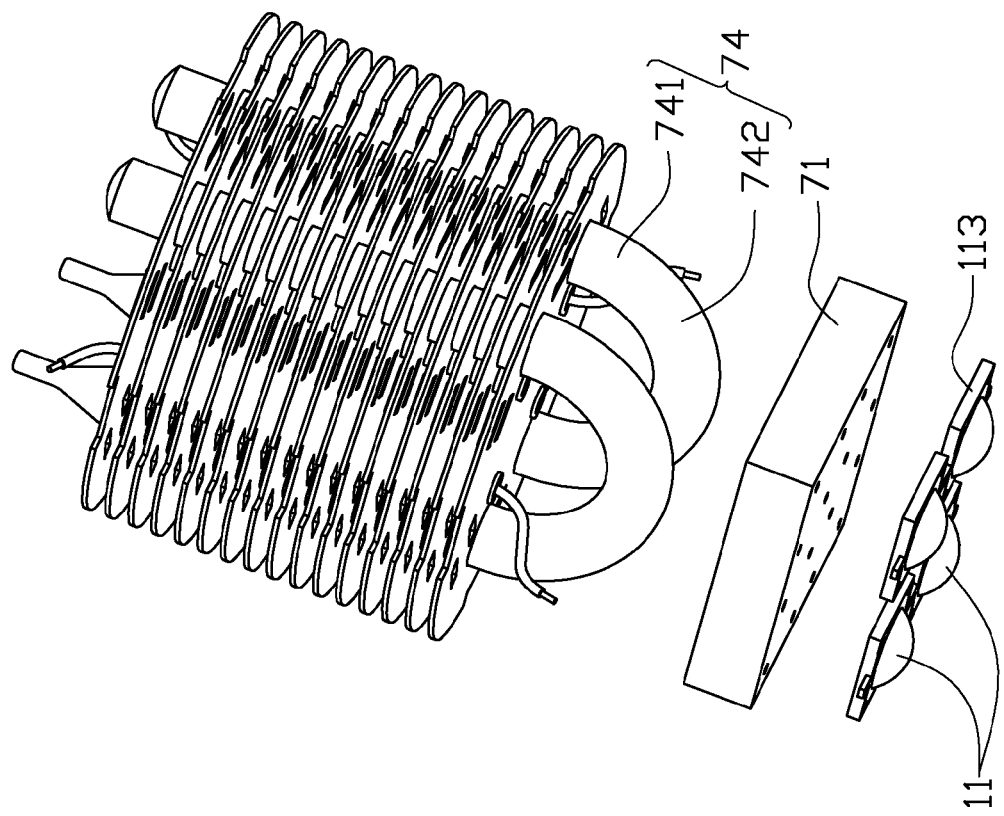
FIG. 11 is an exploded, isometric view of the light engine of FIG. 10.
Figure 12:
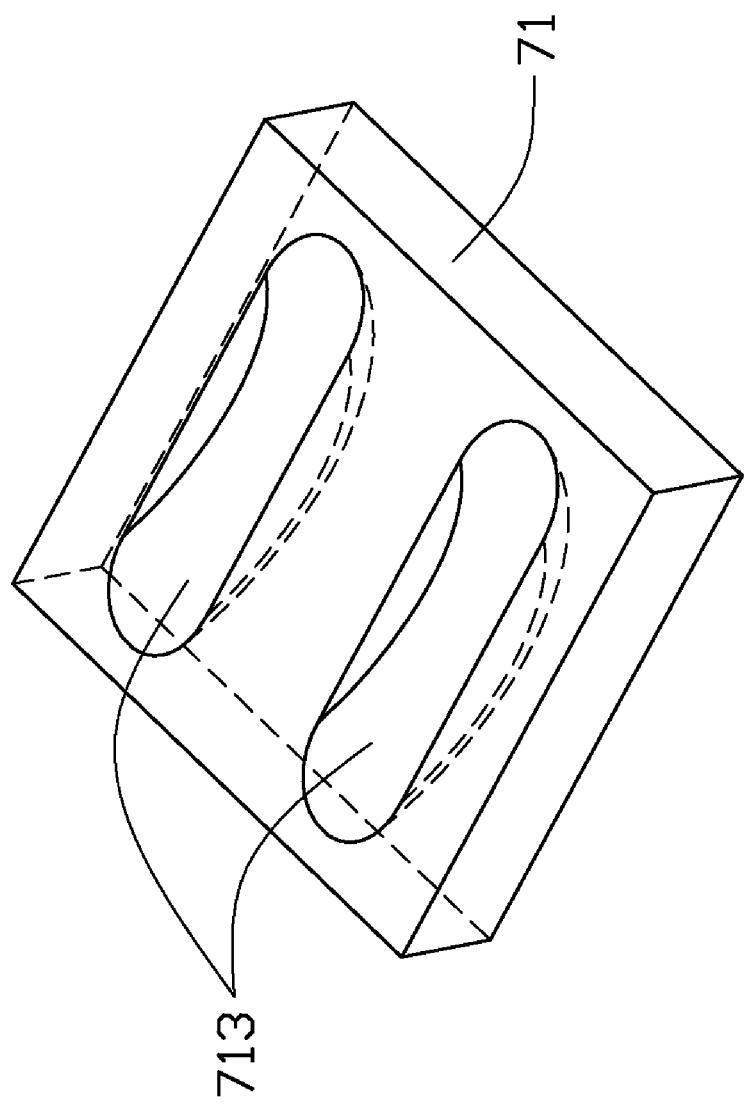
FIG. 12 is an isometric view of the mounting seat of the light engine of FIG. 10.

Referring to FIGS. 10 to 12, the light engine 73 of the LED illumination device 100 in accordance with a fifth embodiment of the disclosure is shown, differing from the first embodiment only in that there are two U-shaped heat pipes 74 and a plurality of LEDs 11 are utilized. Each of the heat pipes 74 includes an arcuate evaporation section 742 and two condensation sections 741 extending upwardly and perpendicularly from two opposite ends of the evaporation section 742, respectively. The evaporation sections 742 of the heat pipes 74 are inserted into the heat sink 25. The mounting seat 71 defines two arcuate grooves 713 in a top surface thereof, for receiving the evaporation sections 742 of the heat pipes 74 therein, respectively. The LEDs 11 are mounted on a bottom surface of the mounting seat 71.

It is believed that the disclosure and its advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An LED illumination device, comprising:
    an optical section at a front end of the LED illumination device, the optical section comprising at least one LED and a light output housing around the at least one LED;
    an electrical section at a rear end of the LED illumination device, the electrical section electrically connecting with the at least one LED; and
    a heat dissipation section located between the optical section and the electrical section and comprising:
        at least one U-shaped heat pipe comprising an evaporation section and two condensation sections extending backwardly from two opposite ends of the evaporation section, respectively;
        a heat sink into which the condensation sections of the at least one heat pipe are inserted; and
        a mounting seat bestriding on the evaporation section of the at least one heat pipe, the at least one LED thermally connecting with evaporation section of the at least one heat pipe via the mounting seat;
    wherein the heat dissipation section further comprises a frame supporting the heat sink, and a holder mechanically connecting the heat dissipation section with the electrical section, the frame comprises a base and a plurality of arms extending backwardly and axially from the base, the arms are fixed on the holder, and the at least one heat pipe, the heat sink and the mounting seat are received in a space cooperatively defined by the base, the arms and the holder.

2. The LED illumination device of claim 1, wherein the mounting seat is saddle-shaped and defines at least one groove in a rear surface thereof, the at least one groove receiving the evaporation section of the at least one heat pipe therein, and the at least one LED being attached to a front surface of the mounting seat.

3. The LED illumination device of claim 2, wherein the at least one groove is rectangular and communicates the a left side with a right side of the mounting seat, the evaporation section is straight and flat, and an outer surface of the evaporation section is contacted intimately with an inner surface of mounting seat surrounding the groove.

4. The LED illumination device of claim 2, wherein the evaporation section is arcuate, and the at least one groove is arcuate for matching with the evaporation section.

5. The LED illumination device of claim 1, wherein the mounting seat comprises a plurality of U-shaped fasteners, and the fasteners mount the at least one LED directly on the evaporation section.

6. The LED illumination device of claim 1, wherein the heat sink defines a plurality of latching grooves at an outer circumferential surface thereof, the arms are inserted into the latching grooves, respectively.

7. The LED illumination device of claim 1, wherein the holder defines an annular groove and a plurality of orientation grooves in a front end thereof, the orientation grooves are axially defined in an inner circumferential surface of the holder and communicate with the annular groove, each of the arms forms an orientation pin at a free end thereof, and the orientation pins of the arms are inserted into the orientation grooves, respectively, for fixing the holder on the frame.

8. The LED illumination device of claim 1, wherein the heat sink defines a plurality of through holes therein, the holder also defines a plurality of through holes therein, a plurality of electric wires extend from the at least one LED through the through holes of the heat sink and the holder, for electrically connecting the LED with the electrical section.

9. The LED illumination device of claim 1, wherein the light output housing comprises a light reflector and a shell enclosing the light reflector, the shell defines a circular engaging groove in an inner circumferential surface thereof, the base forms a plurality of protuberances at an outer circumferential surface of a front portion thereof, and the protuberances engage in the engaging groove of the shell.

10. The LED illumination device of claim 1, wherein the electrical section comprises an enclosure and a circuit board in the enclosure, the enclosure forms an axial orientation pin and defines a circular engaging groove at an inner circumferential surface thereof, the holder forms a plurality of protuberances and defines an axial orientation groove at an outer circumferential surface thereof, the orientation pin of the enclosure is inserted into the orientation groove of the holder, and the protuberances of the holder engage interferentially in the engaging groove of the enclosure for mounting the enclosure on the holder.

* * * * *